United States Patent [19]
White et al.

[11] Patent Number: 6,016,611
[45] Date of Patent: Jan. 25, 2000

[54] GAS FLOW CONTROL IN A SUBSTRATE PROCESSING SYSTEM

[75] Inventors: John M. White, Hayward; Wendell T. Blonigan, Union City; Michael W. Richter, Sunnyvale, all of Calif.

[73] Assignee: Applied Komatsu Technology, Inc., Tokyo, Japan

[21] Appl. No.: 09/115,110

[22] Filed: Jul. 13, 1998

[51] Int. Cl.[7] .................................................. F26B 13/30
[52] U.S. Cl. ................................................. 34/92; 34/210
[58] Field of Search .............................. 34/92, 60, 209, 34/210, 218

[56] References Cited

U.S. PATENT DOCUMENTS 5,516,367  5/1996  Lei et al. ................................. 118/725

FOREIGN PATENT DOCUMENTS 2114470  9/1972  Germany .

Primary Examiner—Henry Bennett
Assistant Examiner—Malik N. Drake
Attorney, Agent, or Firm—Fish & Richardson

[57] ABSTRACT

A substrate processing system can include an evacuable chamber adjacent a process chamber and back-to-back process chambers, or other combinations of evacuable chambers and process chambers. The processing system includes various isolation valves disposed between adjacent chambers, as well as gas flow valves and vacuum valves. A controller controls the respective positions of the various gas flow valves and vacuum valves depending, in part, on whether the various isolation valves are in their open or sealed positions. By controlling the positions of the valves, the flow of gas to and from the different chambers can be controlled, for example, to help maximize throughput, increase efficiency, and reduce the likelihood of cross-contamination between chambers.

11 Claims, 14 Drawing Sheets

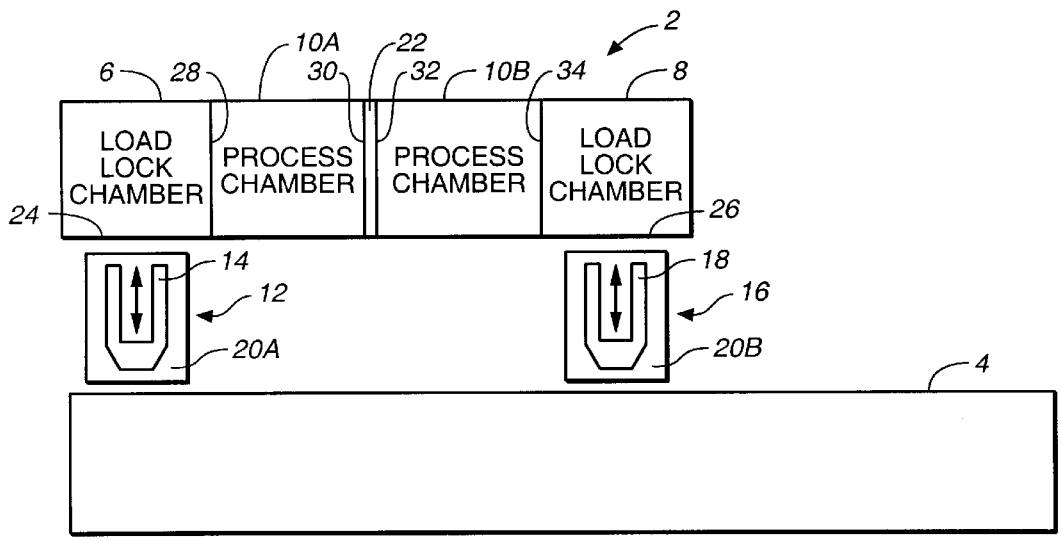
FIG._1
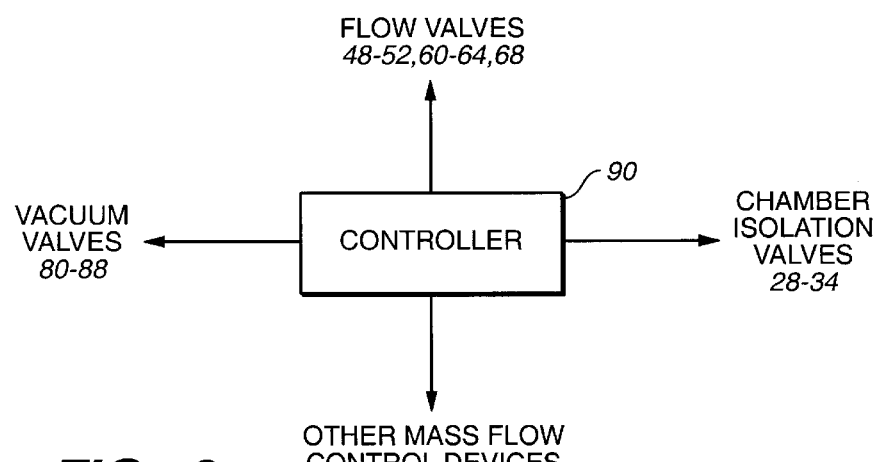
FIG._3

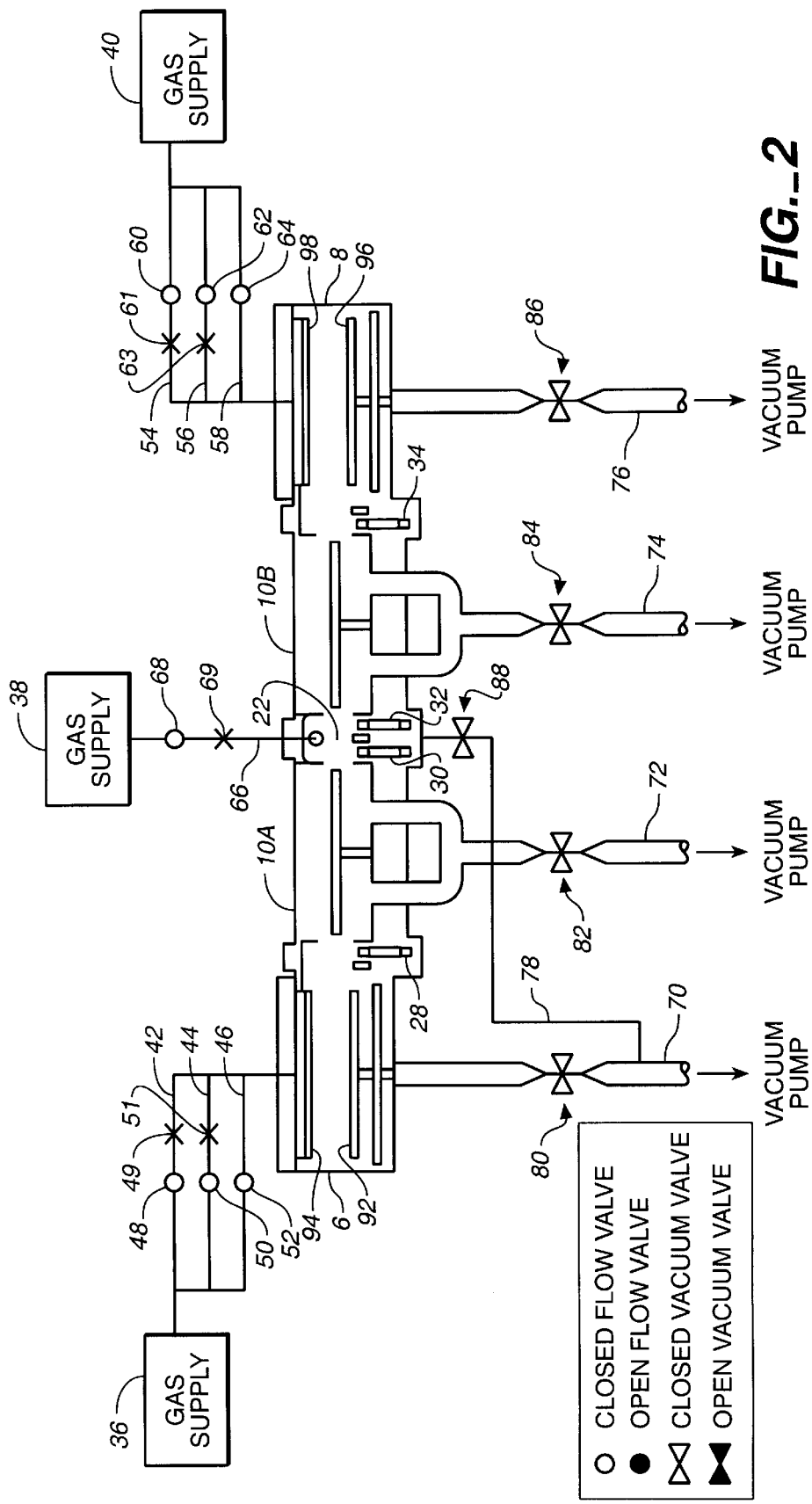
FIG._2

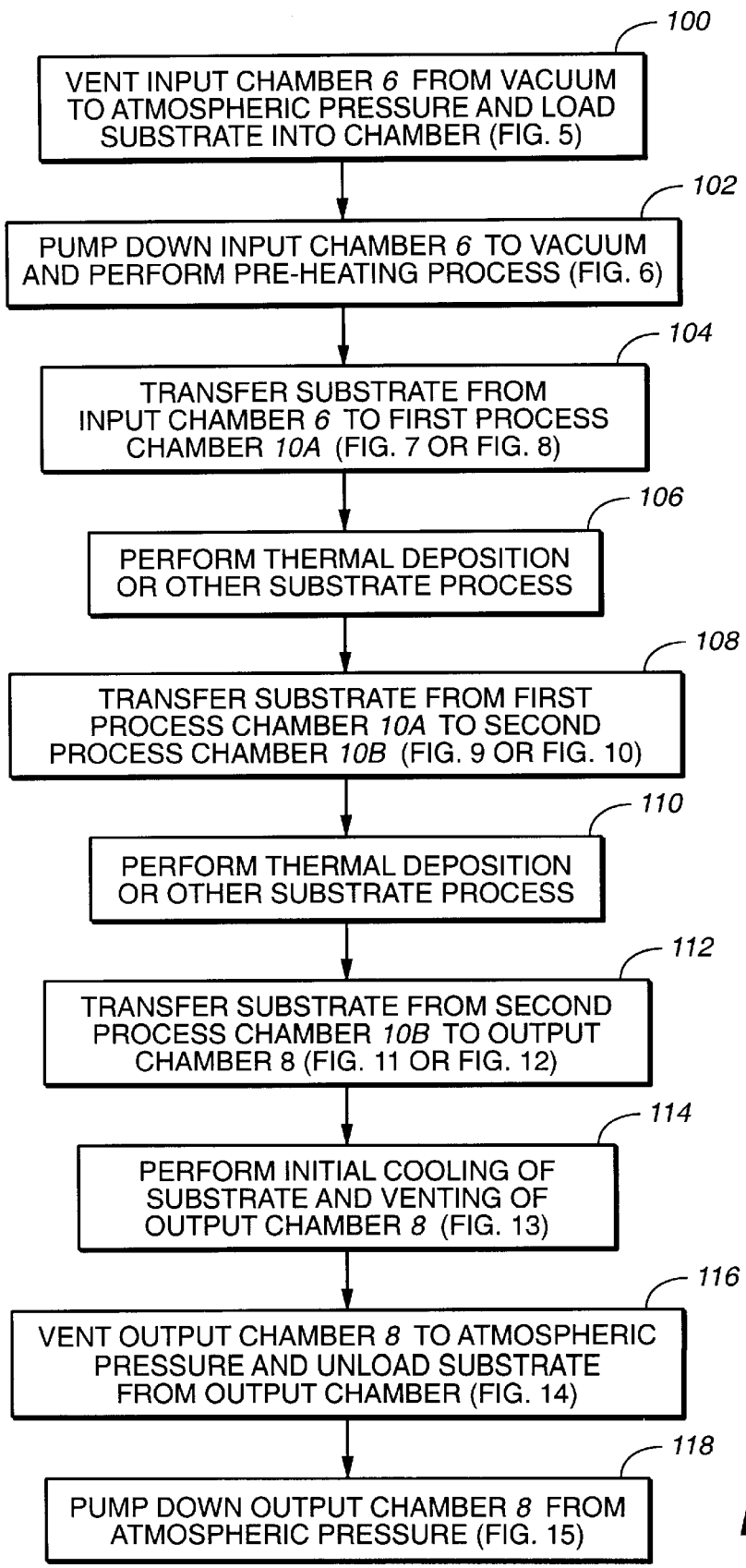
FIG._4

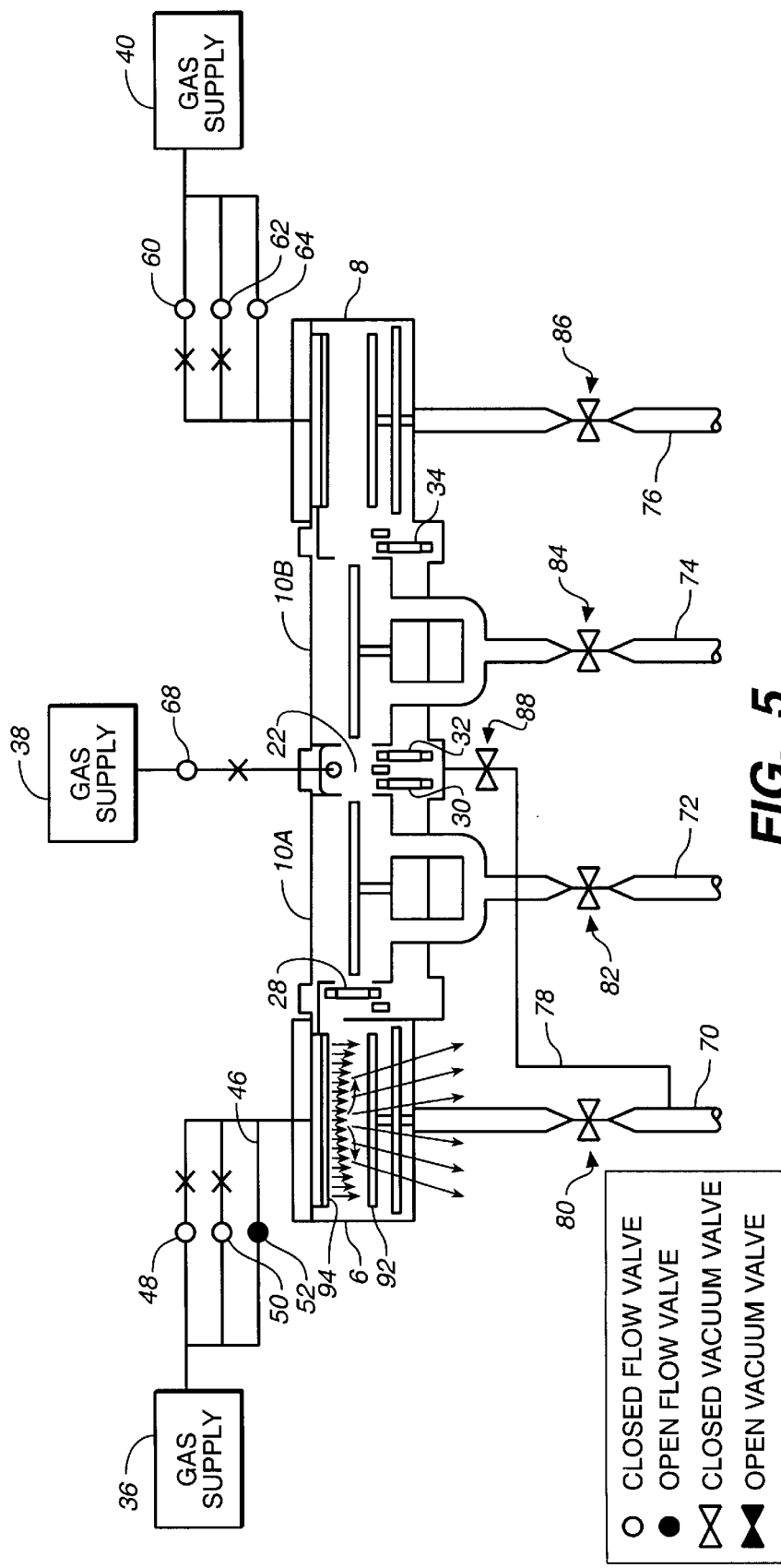
FIG._5

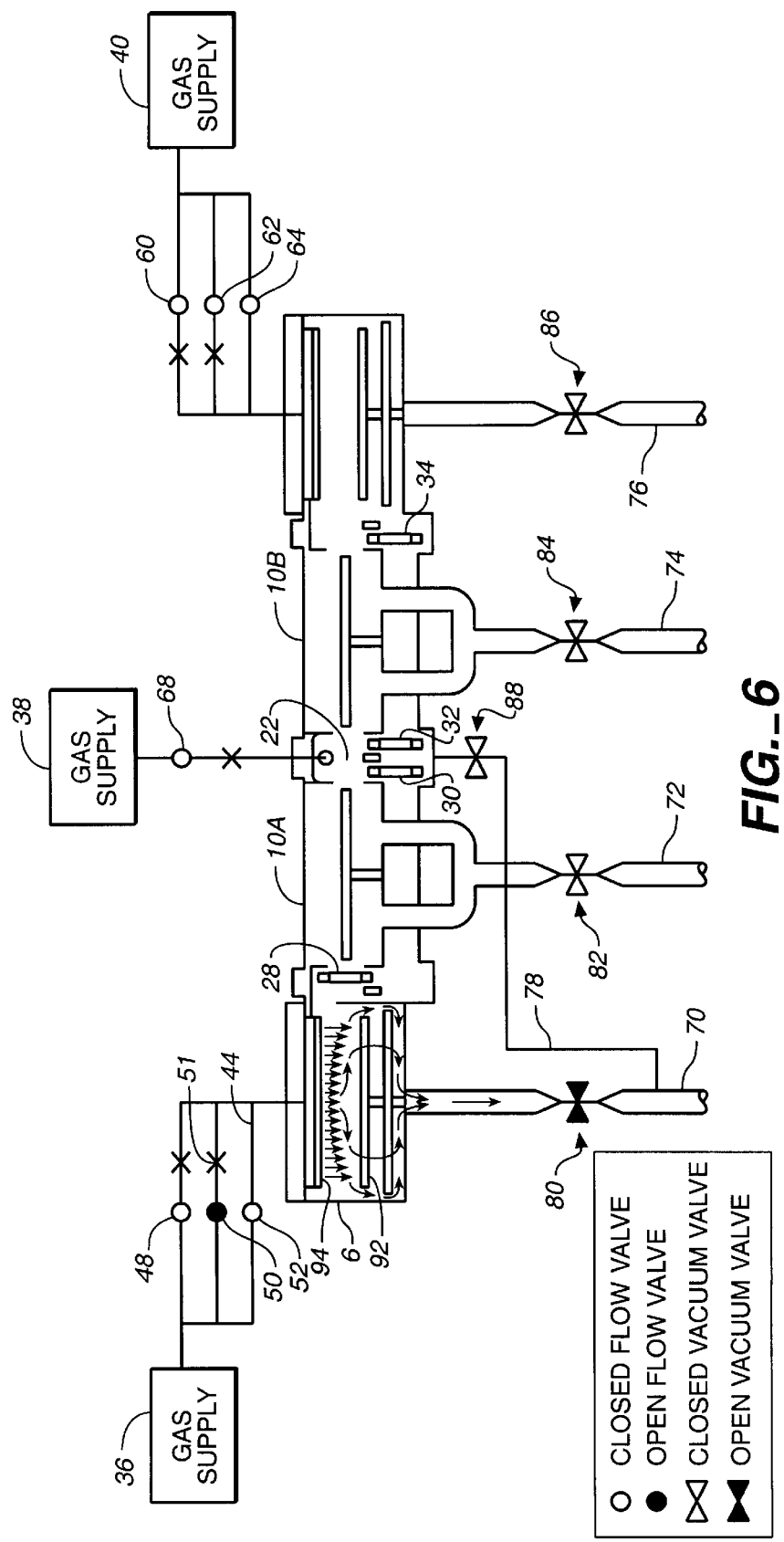

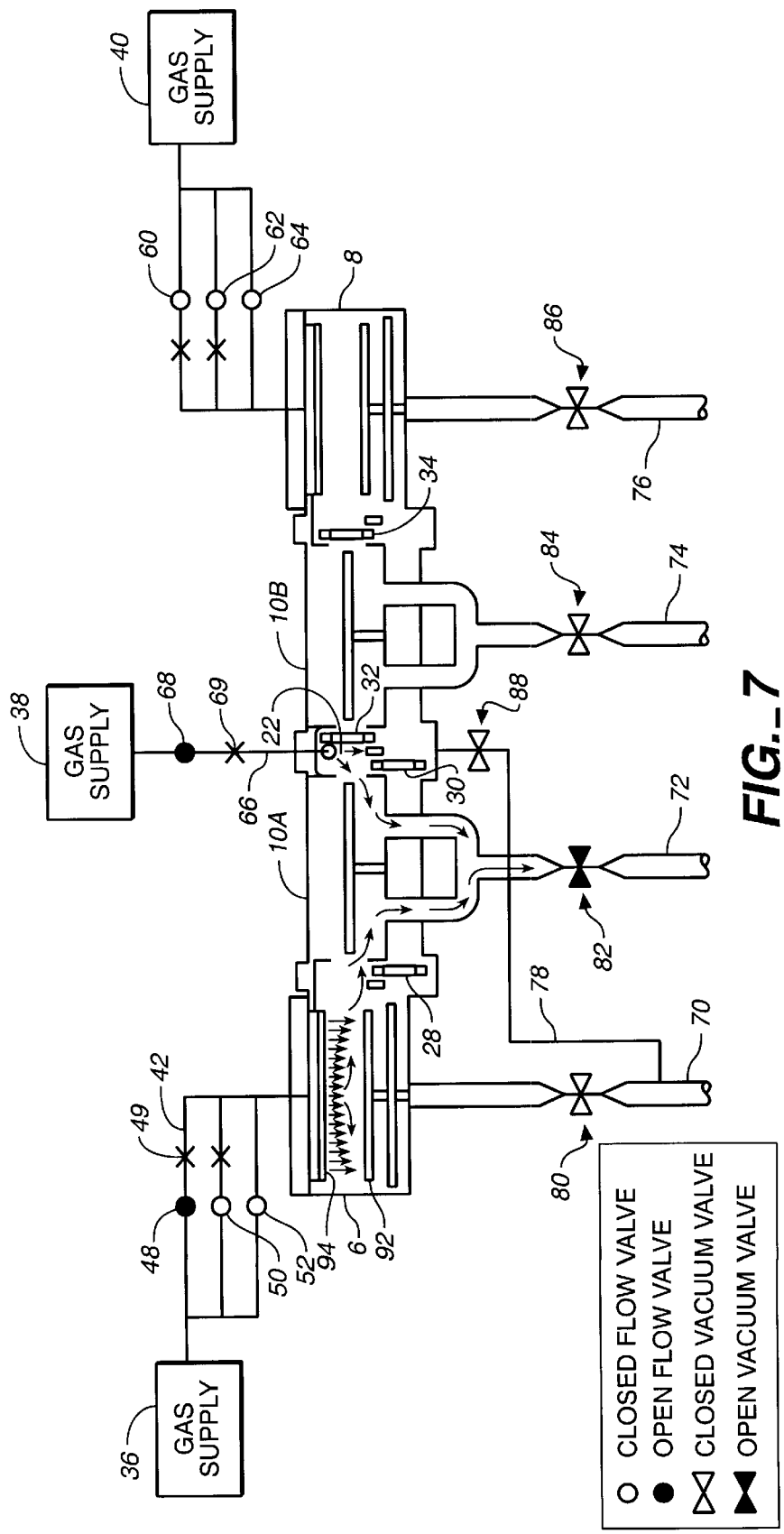

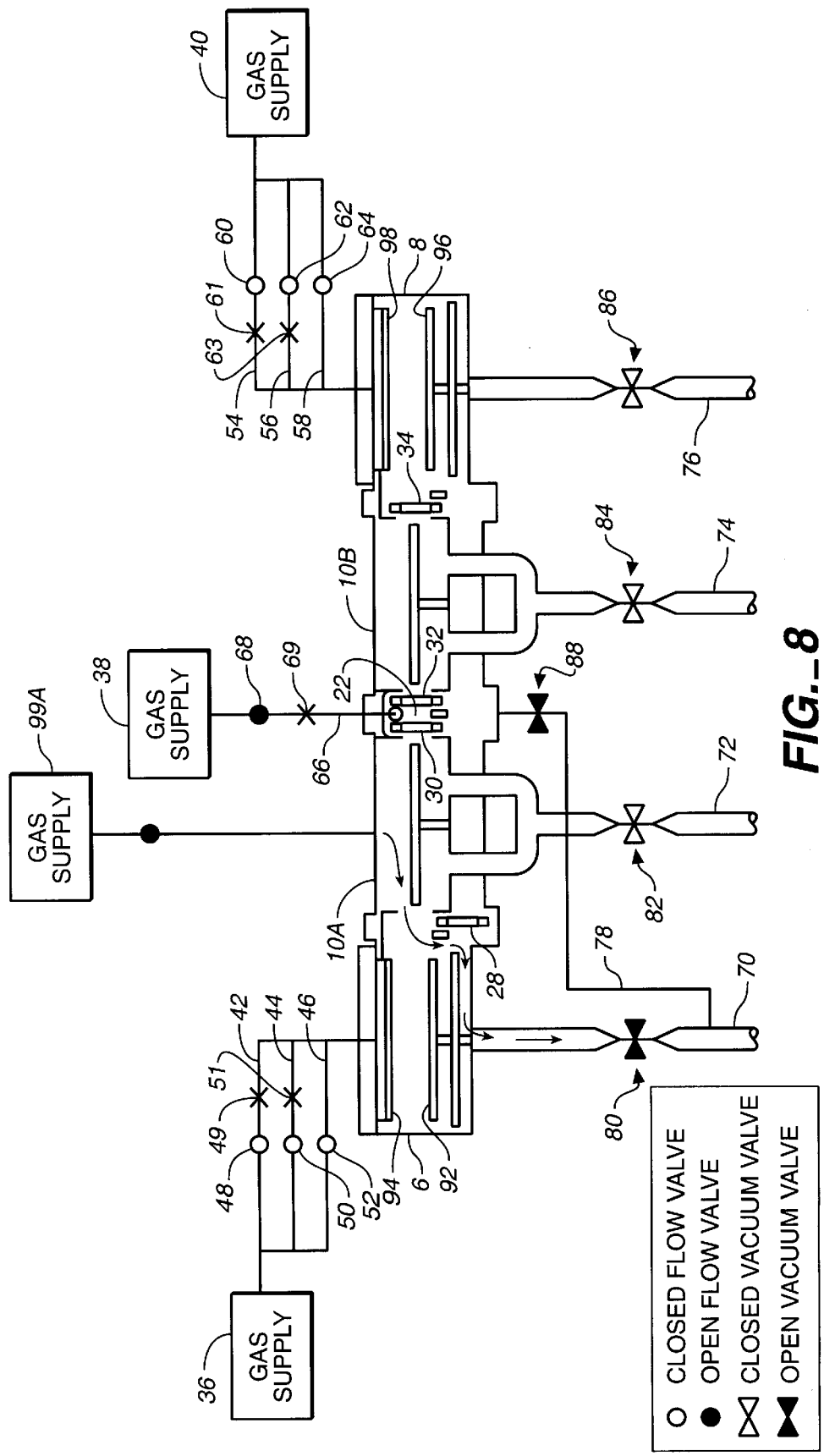
FIG._8

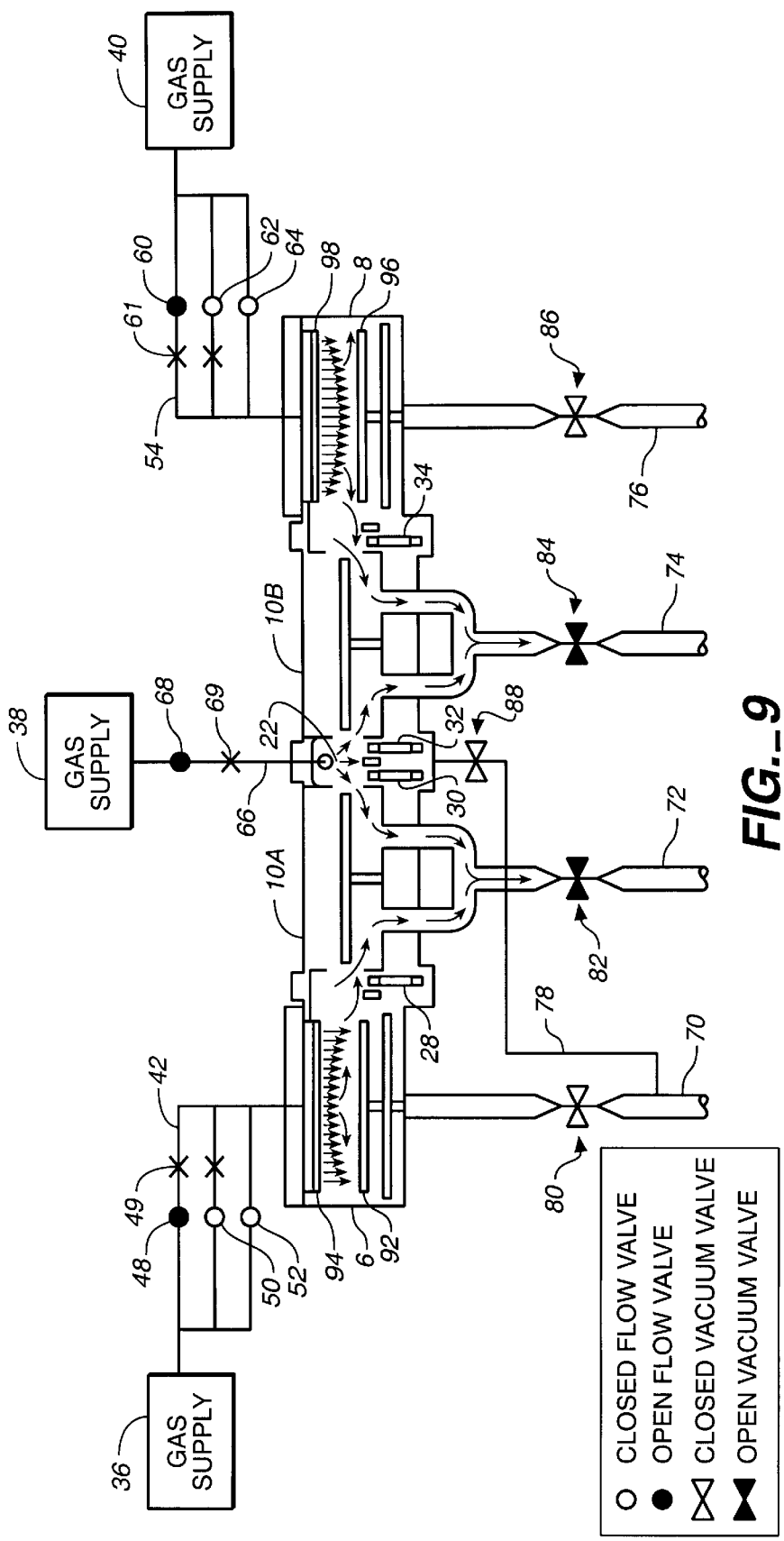
FIG._9

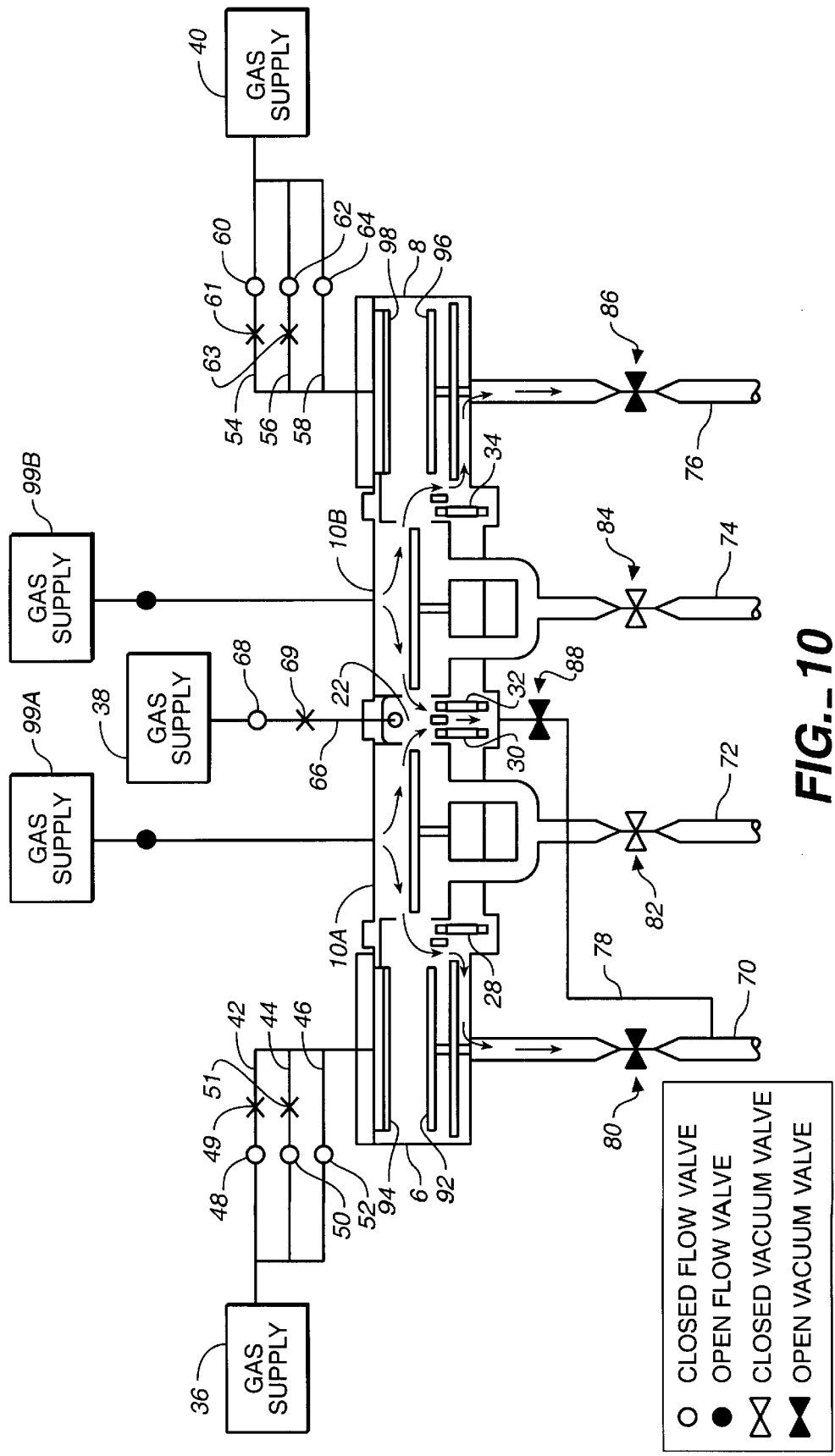
FIG._10

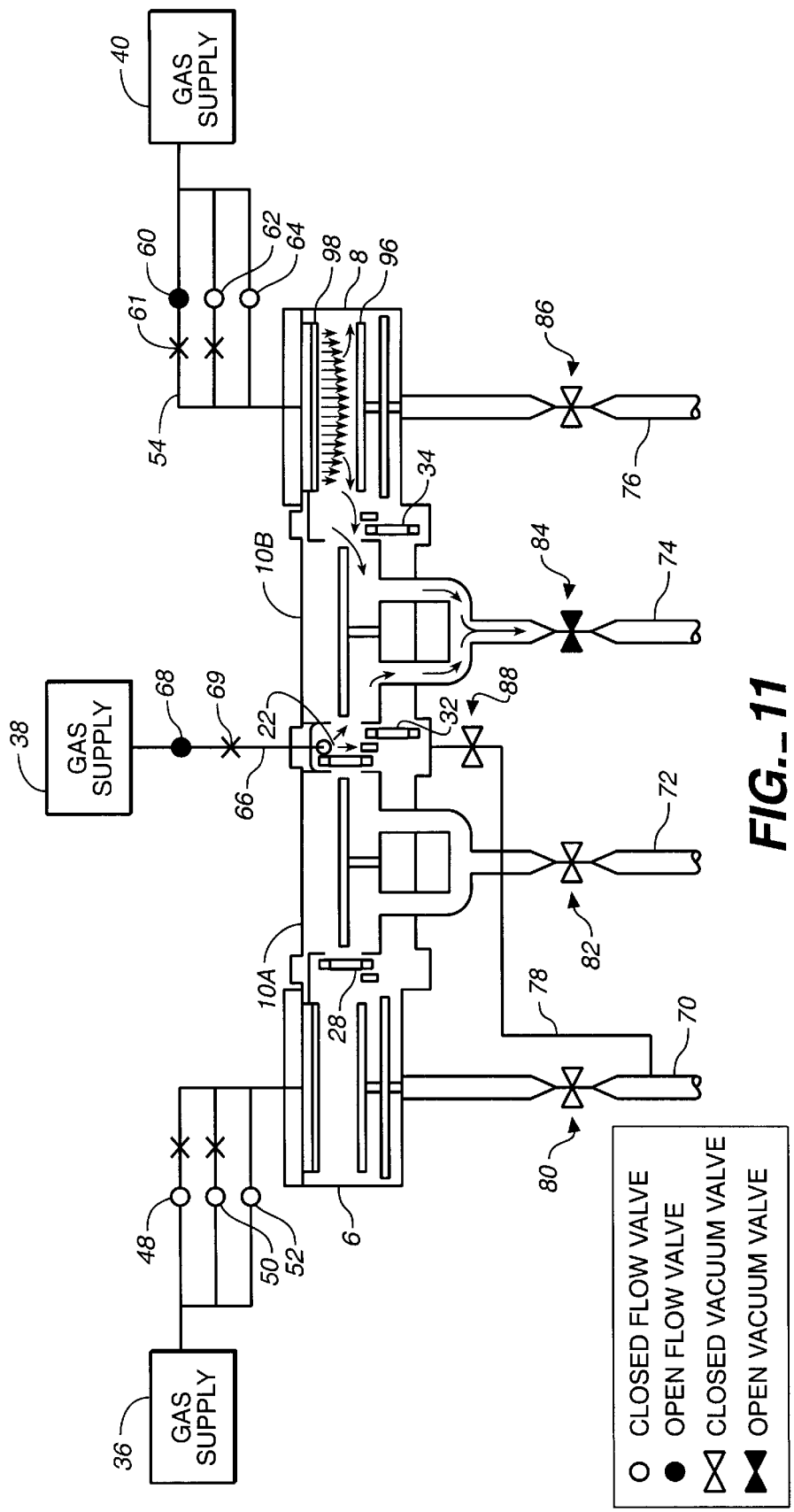
FIG._11

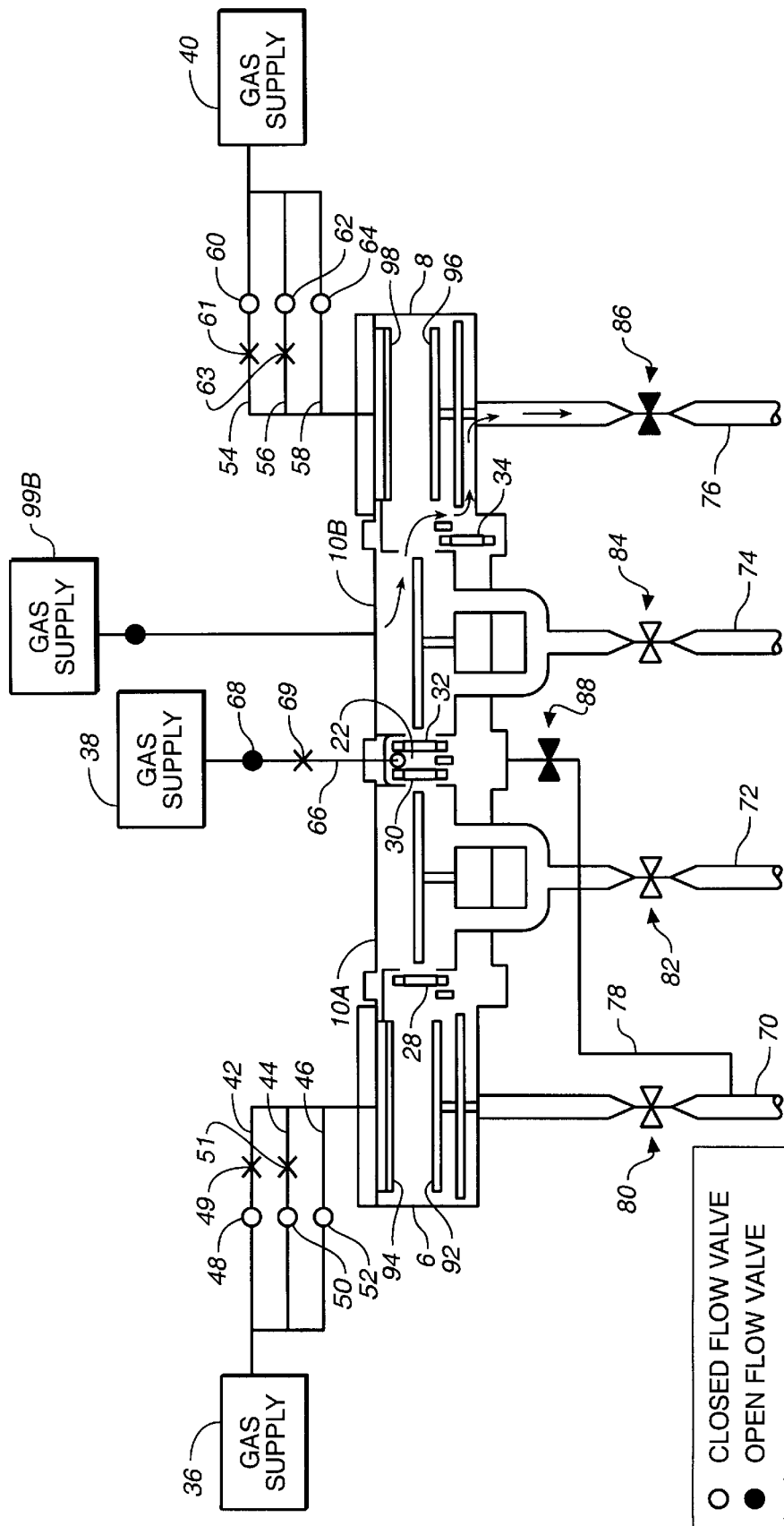
FIG._12

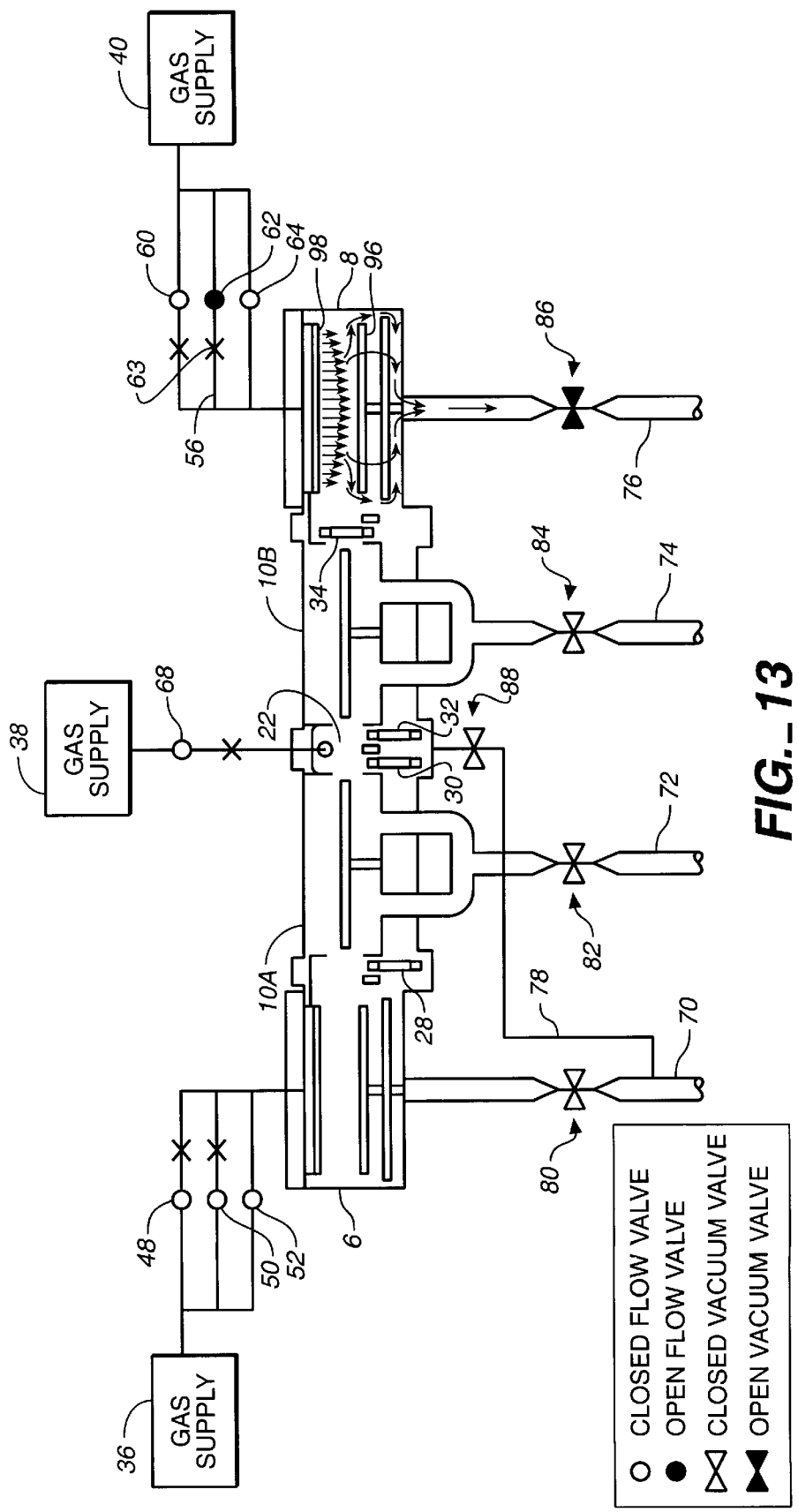
FIG._13

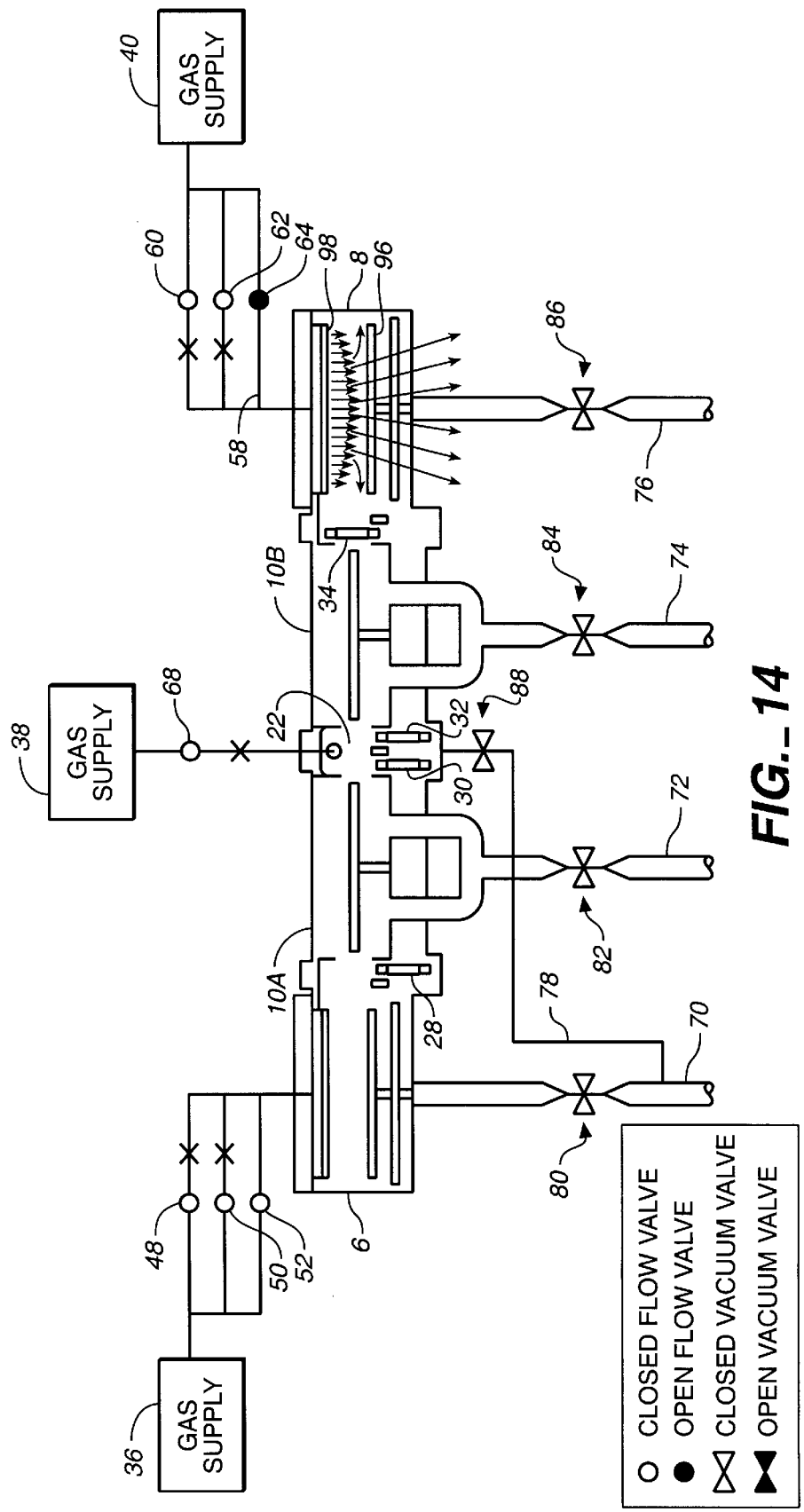
FIG._14

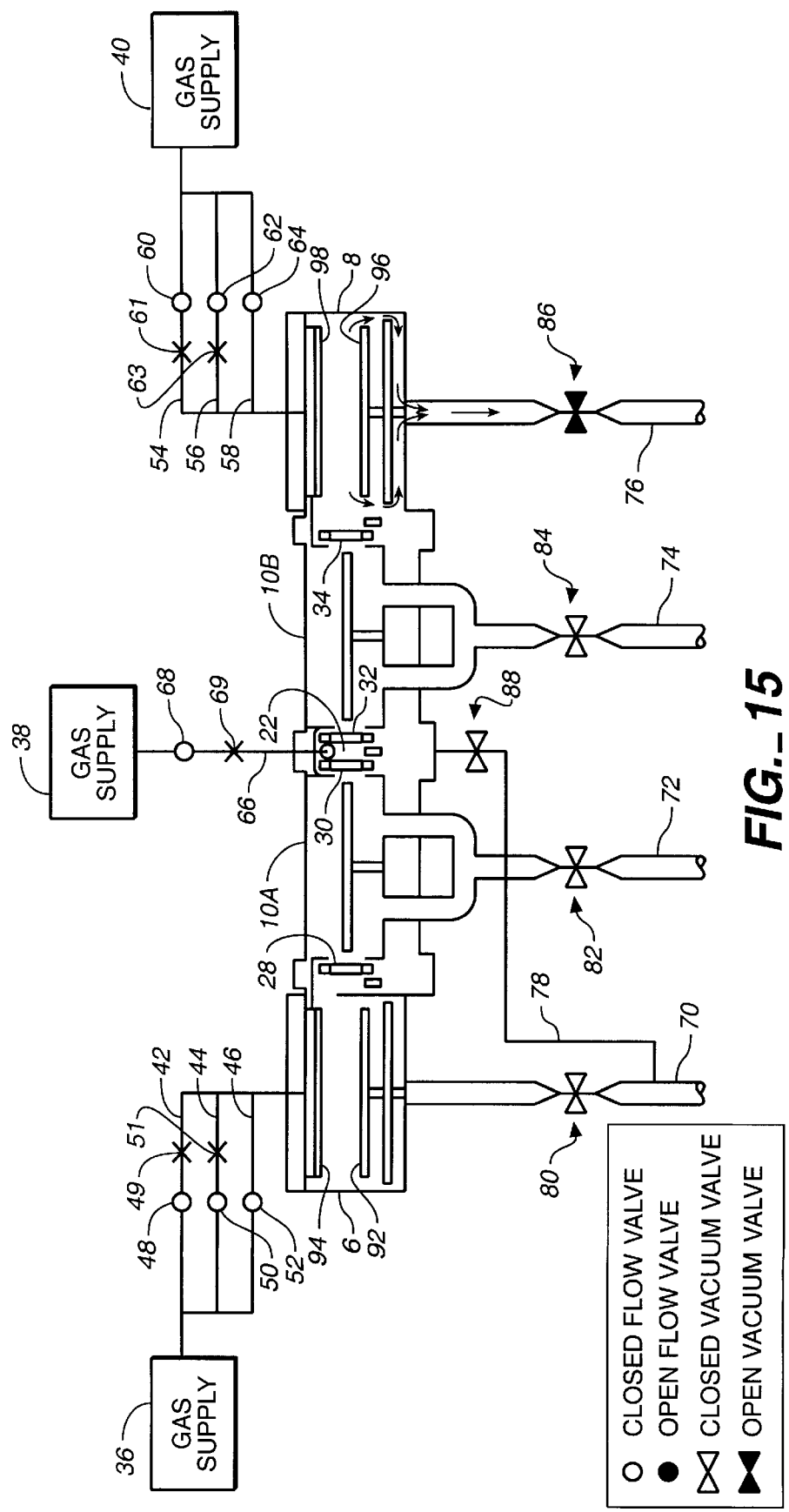
FIG._15

GAS FLOW CONTROL IN A SUBSTRATE PROCESSING SYSTEM

RELATED APPLICATIONS

The present application is related to co-pending U.S. patent application Ser. No. 08/946,922, filed Oct. 8, 1997 and entitled "Modular On-Line Processing System," as well as the following co-pending U.S. patent applications which were filed on May 20, 1998: (1) Ser. No. 09/082,428, entitled "Method and Apparatus for Substrate Transfer and Processing"; (2) Ser. No. 09/082,376, entitled "Isolation Valves"; (3) Ser. No. 09/082,413, entitled "An Automated Substrate Processing System"; (4) "Substrate Transfer Shuttle Having a Magnetic Drive System," 09/082,605; (5) Ser. No. 09/082,484, entitled "Substrate Transfer Shuttle"; (6) Ser. No. 09/082,488, entitled "In-Situ Substrate Transfer Shuttle"; (7) Ser. No. 09/082,483, entitled "Modular Substrate Processing System"; and (8) Ser. No. 09/082,375, entitled "Multi-Function Chamber For A Substrate Processing System."

The foregoing patent applications, which are assigned to the assignee of the present application, are incorporated herein by reference in their entirety.

BACKGROUND

The present invention relates generally to substrate processing systems, and, in particular, to gas flow control in a substrate processing system.

Glass substrates containing as many as one million thin film transistors are being used for applications such as active matrix television and computer displays, among others.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

Some of the basic processing techniques for depositing thin films on the large glass substrates are generally similar to those used, for example, in the processing of semiconductor wafers. Despite some of the similarities, however, a number of difficulties have been encountered in the processing of large glass substrates that cannot be overcome in a practical way and cost effectively by using techniques currently employed for semiconductor wafers and smaller glass substrates.

For example, efficient production line processing requires rapid movement of the glass substrates from one work station to another, and between vacuum environments and atmospheric environments. The large size and shape of the glass substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger glass substrates, such as 650 mm by 830 mm and above. Moreover, cluster tools require a relatively large floor space.

Similarly, chamber configurations designed for the processing of relatively small semiconductor wafers are not particularly suited for the processing of these larger glass substrates. The chambers must include apertures of sufficient size to permit the large substrates to enter or exit the chamber. Moreover, processing substrates in the process chambers typically must be performed in a vacuum or under low pressure. Movement of glass substrates between processing chambers, thus, requires the use of valve mechanisms which are capable of closing the especially wide apertures to provide vacuum-tight seals and which also must minimize contamination.

Furthermore, when a large glass substrate is intended for subsequent use as a single item, such as a flat panel display, relatively few defects in the substrate can cause the entire unit to be rejected. Therefore, reducing the occurrence of defects in the glass substrate when it is transferred from one position to another is critical. Similarly, misalignment of the substrate as it is transferred and positioned within the processing system can cause the process uniformity to be compromised to the extent that one edge of the glass substrate is electrically non-functional once the glass has been formed into a display. If the misalignment is severe enough, it even may cause the substrate to strike structures and break inside the vacuum chamber.

Other problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of the surface of a processed substrate. Moreover, heating or cooling the substrates quickly and uniformly is more difficult as a consequence of its poor thermal conductivity, thereby reducing the ability of the system to achieve a high throughput.

One recently proposed system for processing large glass substrates is a modular in-line processing system, such as the system described in the previously mentioned U.S. patent application Ser. No. 08/946,922. Such a system can include multiple back-to-back input, output and processing chambers. The venting and purging of the various chambers should be coordinated to maximize throughput, increase efficiency, the reduce the likelihood of cross-contamination between chambers.

SUMMARY

In general, a substrate processing system can include, for example, an evacuable chamber adjacent a process chamber, back-to-back process chambers, or other combinations of evacuable chambers and process chambers. The processing system includes various isolation valves disposed between adjacent chambers, as well as gas flow valves and vacuum valves. A controller controls the respective positions of the various gas flow valves and vacuum valves depending, in part, on whether the various isolation valves are in their open or sealed positions. By controlling the positions of the valves, the flow of gas to and from the different chambers can be controlled, for example, to help maximize throughput, increase efficiency, and reduce the likelihood of cross-contamination between chambers.

Various features present in some implementations are described in greater detail in the detailed description below and in the accompanying drawings.

In general, some of the implementations include one or more of the following advantages. An outward gas flow can be provided through the input chamber door, for example, during substrate loading to help reduce water condensation within the input chamber. Such internal water condensation can react with residual corrosive gases that may flow into the input chamber from the process chambers. Thus, reducing the internal water condensation can help prevent corrosive reactions within the input chamber. Similarly, an outward gas flow can be provided through the output chamber door during substrate unloading to help reduce internal water condensation within the output chamber. The outward gas flows also can decrease the time required for transitions from vacuum or other low pressure to atmospheric pressure, thereby permitting an increase in the system throughput.

A restricted flow of pre-heated gas can be provided to the input chamber, for example, during initial stages of a transition to vacuum to facilitate heating the substrate by convective processes. The convective heating can speed up the heating process performed prior to transferring the substrate to a process chamber. Similarly, a restricted flow of pre-cooled gas can be provided to the output chamber, for example, during initial stages of a transition to atmospheric pressure can facilitate cooling the substrate by convective processes. The convective cooling can speed up the cooling process performed prior to unloading the substrate from the output chamber. Such heating and cooling of the respective input and output chambers can increase the throughput of the system further. The flow of gas in the input and output chambers, respectively, during the pre-heating and pre-cooling processes also can help eliminate any particulate contamination that may be present on the substrate transfer mechanism or related components.

A positive gas flow from the input chamber to an adjacent process chamber can be provided, for example, during transfer of the substrate to the process chamber to reduce contamination of the input chamber from residual process gases or other contaminants remaining in the process chamber. Similarly, a positive gas flow can be provided from the output chamber to an adjacent process chamber during transfer of the substrate to the output chamber to reduce contamination of the output chamber from residual process gases or other contaminants remaining in the process chamber. On the other hand, when an inert gas is used as the process gas in the process chambers, the gas flow between the input or output chambers and adjacent process chambers can be reversed to keep water vapor out of the process chambers.

If the substrate processing system includes two or more process chambers, the region between adjacent process chambers can be purged and vented when the region is sealed from the chambers. Purging the region between the process chambers can help reduce particulate contamination present on the substrate transfer mechanism or associated components, such as drive pinions and rollers. Such particulate contamination, which should be reduced as much as possible, can occur, for example, as a result of wear and tear of the substrate transfer mechanism and also from residual gases or other materials from the process chambers.

When the region between adjacent process chambers is not sealed, a positive gas flow can be provided from the central area to the process chambers to reduce cross-contamination due to residual process gases that may remain in the process chambers.

The foregoing features and advantages can be particularly useful in overcoming the unique challenges presented in purging and venting the large chambers required in a system for handling glass substrates on the order of 650 mm by 830 mm and higher.

Other features and advantages will be apparent from the following detailed description, accompanying drawings and claims.

BRIEF DESCRIPTION OF THE DRAWINGS

FIG. 1 is a top plan schematic view of a substrate processing system.

FIG. 2 illustrates further details of the substrate processing system according to the invention.

FIG. 3 illustrates a control system for the substrate processing system of FIG. 2.

FIG. 4 illustrates the an exemplary process for transferring a substrate through the system of FIG. 1.

FIG. 5 illustrates a flow control when the substrate is loaded into an input chamber.

FIG. 6 illustrates a flow control when the input chamber is pumped down from atmospheric pressure and a pre-heating process is performed.

FIG. 7 illustrates a flow control when the substrate is transferred from the input chamber to a first process chamber.

FIG. 8 illustrates an alternative flow control when the substrate is transferred from the input chamber to the first process chamber.

FIG. 9 illustrates a flow control when the substrate is transferred from the first process chamber to the second process chamber.

FIG. 10 illustrates an alternative flow control when the substrate is transferred from the first process chamber to the second process chamber.

FIG. 11 illustrates a flow control when the substrate is transferred from the second process chamber to an output chamber.

FIG. 12 illustrates an alternative flow control when the substrate is transferred from the second process chamber to the output chamber.

FIG. 13 illustrates a flow control when post-process cooling of the substrate is performed and venting of the output chamber to atmospheric pressure is initiated.

FIG. 14 illustrates a flow control when the substrate is unloaded from the output chamber.

FIG. 15 illustrates a flow control when the output chamber is pumped down from atmospheric pressure.

DETAILED DESCRIPTION

Referring to FIGS. 1 and 2, a glass substrate processing system may include one or more islands 2. Each island 2 includes a first or input load lock chamber 6, one or more process chambers 10A, 10B, and a second or output load lock chamber 8. In various implementations, the process chambers 10A, 10B are, for example, chemical vapor deposition (CVD) chambers, physical vapor deposition (PVD) chambers or etch chambers. The load lock chambers 6, 8 are evacuable chambers. In the illustrated implementation, the input chamber 6 performs pre-process heating of a substrate, and the output chamber 8 performs post-process cooling of the substrate. Suitable chamber designs for the input and output chambers 6, 8 are described, for example, in the previously mentioned U.S. patent application Ser. No. 09/082,375. Thus, in one implementation, the input chamber 6 includes a vertically movable heating platen 92 and an upper heating assembly 94 that allow a substrate to be heated by conductive heating, radiative heating and forced convection. Similarly, in one implementation, the output chamber 8 includes a vertically movable cooling platen 96 and an upper cooling assembly 98 that allow a substrate to be cooled by conductive cooling, radiative cooling and forced convection.

A conveyor 4 transports glass substrates, which can be on the order of one square meter, to and from the island 2 where one or more process steps can be performed sequentially to the substrate. An atmospheric loading robot 12 with an end effector 14 can deliver substrates from the conveyor 4 to the input load lock chamber 6 through a door 24 in the load lock chamber. Similarly, an atmospheric unloading robot 16 with an end effector 18 can unload substrates from the output load lock chamber 8 to the conveyor 4 through a door 26. Each of the doors 24, 26 can be open or shut. As illustrated in FIG. 1, a fresh substrate 20A is loaded into the load lock chamber 6 by the loading end effector 14, and a processed substrate 20B is removed from the load lock chamber 8 by the unloading end effector 18.

A substrate transfer mechanism can transfer the substrates 20A, 20B between the various chambers 6, 10A, 10B and 8 through isolation valves 28, 30, 32 and 34. Suitable isolation valves are described, for example, in the previously mentioned U.S. patent application Ser. No. 09/082,376, entitled "Isolation Valves." Each isolation valve 28–34 can be either in an open position or in a sealed position. As shown in FIG. 2, each of the isolation valves is in its respective open position. A suitable substrate transfer mechanism is described, for example, in the previously mentioned U.S. patent application Ser. Nos. 09/082,605; 09/082,484; and 09/082,488. The region 22 between the process chambers 10A, 10B is referred to as a buffer region or buffer chamber. A drive gear (not shown) associated with the substrate transfer mechanism can be located within the buffer region 22.

In general, substrate processing performed in the process chambers 10A, 10B typically must be done in a vacuum or under low pressure, such as approximately from 1 Torr to $10^{-4}$ Torr, with a base pressure as low as $10^{-8}$ Torr. Thus, the load lock chambers 6, 8 perform a transition between atmospheric pressure and the pressure in the process chambers 10A, 10B. For example, the load lock chamber 6 can be pumped down to a low pressure, such as approximately $10^{-3}$ Torr, prior to transferring the substrate to the process chamber 10A. Similarly, after the substrate is transferred from the process chamber 10B to the output chamber 8, the output chamber 8 can be brought to atmospheric pressure prior to transferring the substrate to the conveyor 4.

As previously discussed, the purging and venting of chambers in a system for handling large glass substrates on the order of 650 mm by 830 mm and higher presents unique challenges due to the large size of the substrates as well as the large size of the chambers. To assist the purging and venting of the various chambers, gas supplies 36, 38 and 40 and vacuum lines 70, 72, 74, 76 and 78 are provided. Each of the gas supplies 36, 38 and 40 can include an inert gas such as nitrogen ($N_2$) or argon ($Ar_2$).

Gas from the supply 36 can be provided to the input chamber 6 via any one of three flow paths 42, 44, 46. The paths 42, 44, 46 can be formed, for example, using pipes or other conduits. The radial widths of the flow paths 42, 44, 46 can differ from one another and depend, in part, on the rates of gas required to flow along the respective paths. The flow of gas through the paths is controlled by adjusting the position of flow valves 48, 50, 52, each of which is associated with a respective one of the flow paths 42, 44, 46 and which can be in an open position or a closed position. The valve 48 is referred to as a transfer purge flow valve, the valve 50 is referred to as a heating purge flow valve, and the valve 52 is referred to as a vent flow valve. The rate of gas flow along the paths 42, 44 can be varied by using respective adjustable orifices, such as needle valves 49, 51 or other mass flow control devices. As shown in FIG. 2, each of the flow valves 48, 50, 52 is in its respective closed position so that no gas flows from the supply 36 to the input chamber 6.

Similarly, gas from the supply 40 can be provided to the output chamber 8 via any one of three flow paths 54, 56, 58. The paths 54, 56, 58 also can be formed, for example, using pipes or other conduits, and the radial widths of the flow paths 54, 56, 58 can differ from one another. The flow of gas through the paths is controlled by adjusting the position of flow valves 60, 62, 64, each of which is associated with a respective one of the flow paths 54, 56, 58 and which can be in an open position or a closed position. The valve 60 is a transfer purge flow valve, the valve 62 is a cooling purge flow valve, and the valve 64 is a vent flow valve. The rate of gas flow along the paths 54, 56 can be varied by using respective adjustable orifices, such as needle valves 61, 63, or other mass flow control devices. As shown in FIG. 2, each of the flow valves 60, 62, 64 is in its respective closed position so that no gas flows from the supply 40 to the output chamber 8.

Gas from the supply 38 can be provided to the buffer region 22 via a flow path 66. The flow path 66 can be formed, for example, using pipes or other conduits. A transfer purge flow valve 68 controls whether gas flows from the supply 38 to the buffer region 22. The rate of gas flow can be controlled by using a adjustable orifice, such as needle valve 69.

Multiple vacuum valves 80, 82, 84, 86 and 88 are provided to control the flow of gases from the chambers through the vacuum lines 70–78. Each vacuum valve 80–88 has respective open or closed positions. As shown in FIG. 2, each vacuum valve 80–88 is in its closed position so that no gas flows through the vacuum lines 70–78.

As discussed in greater detail below, a controller 90 (FIG. 3) controls and coordinates the positions of the flow valves 48–52, 60–64, 68, the vacuum valves 80–88, and the chamber isolation valves 28–34 during the various stages of substrate processing and substrate transfer. If mass flow control valves are used instead of manual needle valves, then the controller 90 also controls the mass flow control valves as well.

Referring to FIG. 4, an exemplary process begins when a substrate, such as the glass substrate 20A (FIG. 1), is to be loaded into the input chamber 6 from the atmospheric loading robot 12. Prior to opening the door 24 (FIG. 1) of the input chamber 6, the isolation valve 28 should be in its sealed position (FIG. 5). The input chamber 6 is vented to atmosphere, the door 24 then is opened, and the substrate 20A is loaded into the input chamber 6 (step 100). As indicated in FIG. 5, the vent flow valve 52 is opened while the input chamber 6 is opened to atmosphere and during the subsequent loading of the substrate 20A into the chamber. Opening the vent flow valve 52 allows a maximum gas rate to flow into the chamber 6, thereby increasing the speed at which the input chamber is vented to atmosphere. Once the chamber 6 reaches atmospheric pressure and the door 24 is opened, the gas flows out the door opening. Providing an outward gas flow through the input chamber door during substrate loading can help reduce water condensation within the input chamber. Such internal water condensation can react with residual corrosive gases that may flow into the input chamber from the process chambers. Thus, reducing the internal water condensation can help prevent corrosive reactions within the input chamber.

With the substrate 20A loaded into the chamber 6, the door 24 is closed, the input chamber is pumped down from atmospheric pressure to about $10^{-3}$ Torr, and the substrate is pre-heated (step 102). As indicated by FIG. 6, when the chamber is pumped down from atmospheric pressure, the vacuum valve 80 is opened. Any gas inside the chamber 6 is swept around the perimeter of the heating platen 92 to the vacuum line 70, thereby sweeping any particulate contamination on the substrate transfer mechanism or related components out of the input chamber. If the chamber 6 does not include the heating platen 92, then a pumping diffuser can be provided in the chamber so that any particulate contamination is swept around the perimeter of the diffuser and out the vacuum line 70.

During the initial transition of the input chamber 6 from atmospheric pressure, the heating purge flow valve 50 also is opened (FIG. 6) to allow a restricted amount of gas to flow into an interior region of the chamber. The gas flowing along the flow path 44 and into the top region of the chamber 6 is pre-heated by the upper heating assembly 94 before flowing onto the substrate (not shown in FIG. 6) to facilitate rapid convective heating of the substrate. Following an initial pre-heating period, the heating purge flow valve 52 is closed. Conductive and radiative-type heating complete the pre-heating process, and the chamber 6 is pumped down to the desired low pressure.

The substrate 20A then is transferred from the input chamber to the first process chamber 10A (step 104). As indicated by FIG. 7, the isolation valve 28 between the input chamber 6 and the process chamber 10A is opened. While the substrate is transferred to the process chamber 10A, the transfer purge flow valve 48 is opened to allow gas to flow from the supply 36 to the input chamber 6. The process chamber vacuum valve 82 also is opened so that the gas flows from the input chamber 6 to the process chamber 10A through the open isolation valve 28. The rate of gas flow along the path 42 can be set using the adjustable orifice 49. The flow pattern from the input chamber 6 to the process chamber 10A helps prevent residual gases and other contaminants in the process chamber from contaminating the input chamber. As further shown in FIG. 7, the transfer purge flow valve 68 and the isolation valve 30 also can be opened to provide a more symmetric gas flow into the process chamber 10A. The isolation valve 32, however, remains sealed.

In an alternative embodiment, the flow pattern while the door 24 is closed and the isolation valve 28 is open can be reversed so that gas flows from the process chamber to the input chamber 6. The reverse flow pattern can be used, for example, when a process using only inert gases, such as an argon-based PVD sputtering process, is to be performed in the process chamber 10A. The reverse flow pattern is achieved by keeping the process chamber vacuum valve 82 closed, opening the input chamber vacuum valve 80, and supplying gas flow from the process chamber gas supply 99A (FIG. 8). The reverse flow pattern can help keep water vapor, which may accumulate in the input chamber 6, out of the process chamber 10A. The reverse flow pattern can be used, for example, when the substrate 20A is being transferred to the process chamber 10A. In the alternative embodiment, when the door 24 is open and the isolation valve 28 is sealed, the flow of gas is as shown and described with respect to FIG. 5.

In general, when the isolation valves 30, 32 between the process chambers 10A, 10B are sealed, such as in FIG. 8, gas is provided from the supply 38 to the buffer region 22 by opening the transfer purge flow valve 68. The transfer vacuum valve 88 also is opened so that gas flows over the drive gear and other components located in the buffer region 22 and is swept out the vacuum line 78. Such gas flow sweeps any particulate contamination that may remain on the drive gear for the substrate transfer mechanism out of the buffer region. The rate of gas flow from the supply 38 into the buffer region 22 can be set using the adjustable orifice 69.

Once the substrate 20A has been transferred to the first process chamber 10A, the isolation valve 28 is sealed, the process chamber sets up gas flow and other process-specific variables, and a CVD, PVD or other process can be performed on the substrate (step 106). Thereafter, the substrate 20A is transferred to the second process chamber 10B (step 108).

To transfer the substrate 20A from the first chamber 10A to the second chamber 10B, the isolation valves 30 and 32 are opened (FIG. 9). As the substrate is transferred to the second chamber 10B, positive gas flow is directed from the buffer region 22 into the process chambers 10A, 10B. That flow pattern is accomplished by opening the process chamber vacuum valves 82, 84 and allowing gas to flow from the supply 38 into the buffer region 22 and toward the process chamber vacuum lines 72, 74. The rate of gas flow can be set using the adjustable orifice 69. The transfer vacuum valve 88 remains closed. The flow pattern helps prevent residual process gases and other contaminants that may remain in the process chambers 10A, 10B from cross-contaminating each other.

In some situations, when the isolation valves 30, 2, are open, the isolation valves 28, 34 also are open (FIG. 9). Such a situation may be necessary, for example, during substrate transfer between chambers or to move the shuttle transfer mechanism between the various chambers. If the isolation valves 28, 34 are open, then the transfer purge flow valves 48, 60 are open to allow gas to flow into the input and output chambers 6, 8, respectively. Gas flows from the input chamber 6 to the process chamber 10A through the open isolation valve 28, with the rate of gas flowing along the path 42 set by the position of the adjustable orifice 49. The gas is swept out of the process chamber 10A through the vacuum line 72. Similarly, gas flows from the output chamber 8 to the process chamber 10B through the open isolation valve 34, with the rate of gas flowing along the path 54 set by the position of the adjustable orifice 61. The gas is swept out of the process chamber 10B through the vacuum line 74. Vacuum valves 80, 86 and 88 remain closed. Such a flow pattern helps prevent residual gases in the process chambers 10A, 10B from contaminating the input or output chambers 6, 8.

In an alternative embodiment, as the substrate 20A is transferred from the first process chamber 10A to the second process chamber 10B, the flow pattern is reversed so that gas flows from the process chambers 10A, 10B to the buffer region 22 (FIG. 10). The reverse flow pattern can be used, for example, when a process using only inert gases, such as an argon-based PVD sputtering process, is to be performed in the process chambers. The reverse flow pattern is achieved by keeping the process chamber vacuum valves 82, 84 closed, opening the transfer area vacuum valve 88, and providing gas flow to the process chambers 10A, 10B from the process chamber gas supplies 99A, 99B.

If the isolation valves 28, 34 also are open (FIG. 10) when the reverse flow pattern is used, then the vacuum valves 80, 86 are opened so that gas also flows from the process chambers 10A, 10B to the input and output chambers 6, 8, respectively. As previously indicated, it may be necessary to open all the isolation valves 28–34, for example, to move the substrate transfer mechanism from one end of the system to the other. Such a flow pattern can help keep various contaminants, such as water vapor which may accumulate in the input or output chambers 6, 8, out of the process chambers 10A, 10B.

In the alternative embodiment, when the isolation valves 30, 32 are sealed, gas is provided from the supply 38 to the buffer region 22 by opening the transfer purge flow valve 68. The transfer vacuum valve 88 also is opened so that gas flows over the drive gear and other components located in the buffer region 22 and is swept out the vacuum line 78. Thus, particulate contamination can be swept out of the buffer region 22 as previously described with respect to FIGS. 7 and 8.

Once the substrate 20A has been transferred to the second process chamber 10B, the isolation valves 30, 32 (and 34) are sealed, the second process chamber sets up gas flow and other process-specific variables, and a CVD, PVD or other process can be performed on the substrate (step 110). The substrate 20A then is transferred to the output chamber 8 (step 112).

To transfer the substrate 20A to the output chamber 8, the isolation valve 34 is opened (FIG. 11). While the substrate is transferred to the output chamber 8, the transfer purge flow valve 60 is opened to allow gas to flow from the supply 40 to the output chamber 8. The process chamber vacuum valve 84 also is opened so that the gas flows from the output chamber 8 to the process chamber 10B via the open isolation valve 34 and out through the vacuum line 74. The rate of gas flow along the path 54 can be set using the adjustable orifice 61. The flow pattern from the output chamber 8 to the process chamber 10B helps prevent residual gases and other contaminants in the process chamber from contaminating the output chamber. As further shown in FIG. 11, the transfer purge flow valve 68 and the isolation valve 32 also can be opened to provide a more symmetric gas flow into the process chamber 10A. The isolation valve 30, however, remains sealed.

In an alternative embodiment, the flow pattern while the substrate 20A is being transferred to the output chamber 8 can be reversed so that gas flows from the process chamber 10B to the output chamber 8 (FIG. 12). As previously discussed, the reverse flow pattern can be used, for example, when a process using only inert gases, such as an argon-based PVD sputtering process, was performed in the process chamber 10B. The reverse flow pattern is achieved by keeping the process chamber vacuum valve 84 closed, opening the output chamber vacuum valve 86, and providing gas flow from the process chamber supply 99B. As already noted, the reverse flow pattern can help prevent water vapor, which may accumulate in the output chamber 8, out of the process chamber 10B.

As also discussed above, while the isolation valves 30, 32 between the process chambers 10A, 10B are sealed, gas is provided from the supply 38 to the buffer region 22 by opening the transfer purge flow valve 68 and the vacuum valve 88 (FIGS. 12). Gas flows over the drive gear and other components located in the buffer region 22 and is swept out the vacuum line 78. Such a gas flow sweeps any particulate contamination that may remain on the drive gear for the substrate transfer mechanism out of the buffer region 22.

Once the substrate 20A is transferred to the output chamber 8, post-process cooling of the substrate is performed and venting of the output chamber to atmospheric pressure is initiated (step 114). As indicated by FIG. 13, prior to rapid, unrestricted venting of the output chamber 8 to atmosphere, the cooling purge flow valve 62 is opened to allow a restricted amount of gas to flow into the chamber. Gas flowing along the flow path 56 and into the chamber 8 is pre-cooled by the upper cooling assembly 98 before flowing onto the substrate 20A to facilitate rapid convective cooling of the substrate (not shown in FIG. 13). Following an initial pre-cooling period, the cooling purge flow valve 62 is closed. Conductive and radiative-type cooling complete the substrate cooling process.

Following completion of the substrate cooling process, venting of the output chamber 8 to atmospheric pressure is completed and the processed substrate is unloaded from the output chamber (step 116). To vent the output chamber 8 to atmospheric pressure, the vent flow valve 64 also is opened to allow gas to flow from the supply 40 into the output chamber. Then the door 26 is opened and the gas flows out through the chamber door opening (FIGS. 1, 14).

Once the processed substrate is removed from the output chamber 8, the output chamber 8 is pumped back to vacuum (step 118). The chamber door 26 (FIG. 1) is closed, and the output chamber vacuum valve 86 is opened (FIG. 15). Any gas remaining inside the chamber 8 is swept around the perimeter of the cooling platen 96 and out through the vacuum line 76, thereby sweeping any particulate contamination remaining on the substrate transfer mechanism or related components out of the output chamber. If the output chamber 8 does not include the cooling platen 96, then a pumping diffuser can be provided so that any particulate contamination is swept around the perimeter of the diffuser and out the vacuum line 76.

Although the various gas supplies in the system described above are shown as separate supplies, in some implementations, a single gas supply can serve as two or more of the gas supplies. Additionally, each chamber typically is provided with a shower head or other gas distribution mechanism to disperse the gas from one of the gas supplies into the interior of the associated chamber.

Furthermore, although two process chambers 10A, 10B are shown in the implementations illustrated above, some systems may include only a single process chamber situated between the input chamber 6 and the output chamber 8. In such a configuration, there would be no need for the buffer region 22. Nor would step 108 be performed.

In addition, some systems may include more than two process chambers aligned with one another. In such configurations, a buffer region 22 can be located between each pair of adjacent process chambers. The various valves would be controlled in a manner similar to that described above.

In addition, for the purposes of clarity, the foregoing gas flow patterns have been described in the context of moving a single substrate through the system 2. However, the gas flow patterns described above can be used in other situations as well, including moving the substrate transfer mechanism between the various chambers.

Other implementations are within the scope of the following claims.

What is claimed is:

1. A substrate processing system comprising:

an evacuable chamber having a door which can be opened or closed;

a first process chamber disposed adjacent the evacuable chamber;

an isolation valve having open and sealed positions and disposed between the evacuable chamber and the first process chamber;

a first gas supply;

at least one gas flow path connecting the first gas supply to the evacuable chamber, wherein each gas flow path includes a gas flow valve having open and closed positions;

vacuum lines connected respectively to the evacuable chamber and the first process chamber, wherein each vacuum line includes a vacuum valve having open and closed positions;

a controller for controlling the respective positions of the gas flow and vacuum valves, wherein when the door is open and the isolation valve is in its sealed position, the controller controls the gas flow and vacuum valves to cause gas to flow from the first gas supply into the evacuable chamber and out of the evacuable chamber through the door, and wherein when the door is closed and the isolation valve is open, the controller controls the gas flow and vacuum valves to cause gas to flow from the first gas supply into the evacuable chamber, and from the evacuable chamber into the first process chamber and out the process chamber via the vacuum line connected to the first process chamber.

2. The system of claim 1 wherein when the door is open and the isolation valve is in its sealed position, gas flows from the first gas supply into the evacuable chamber along a first path, and when the door is closed and the isolation valve is open, gas flows from the first gas supply into the evacuable chamber along a second path.

3. The system of claim 1 further including:

a second process chamber;

a region between the first and second process chambers;

an isolation valve having open and sealed positions and disposed between the first chamber and the region between the first and second chambers;

a second gas supply;

a gas flow path including a gas flow valve having open and closed positions and connecting the second gas supply to the region between the first and second process chambers;

wherein when gas is caused to flow from the first gas supply to the first process chamber, the controller also controls the gas flow and isolation valves to cause gas to flow from the second gas supply into the region between the chambers, and from the region between the chambers into the first process chamber and out the first process chamber via the vacuum line connected to the first process chamber.

4. A substrate processing system, comprising:

an evacuable chamber having a door which can be opened or closed;

a process chamber disposed adjacent the evacuable chamber;

an isolation valve having open and sealed positions and disposed between the evacuable chamber and the process chamber;

first and second gas supplies;

a first flow path connecting the first gas supply to the evacuable chamber, and a second flow path connecting the second gas supply to the process chamber, wherein each gas flow path includes a gas flow valve having open and closed positions;

vacuum lines connected, respectively, to the evacuable chamber and the process chamber, wherein each vacuum line includes a vacuum valve having open and closed positions;

a controller for controlling the respective positions of the gas flow valves and the vacuum valves, wherein when the door is open and the isolation valve is in its sealed position, the controller controls the gas flow valves and the vacuum valves to cause gas to flow from the first gas supply into the evacuable chamber and out of the evacuable chamber through the door, and wherein when the door is closed and the isolation valve is open, the controller controls the gas flow valves and the vacuum valves to cause gas to flow from the second gas supply into the process chamber, and from the process chamber into the evacuable chamber and out the evacuable chamber via the vacuum line connected to the evacuable chamber.

5. The system of claim 4 wherein the process chamber is used for processes using inert gases only.

6. A substrate processing system comprising:

first and second process chambers;

a region between the first and second process chambers;

a first isolation valve having open and sealed positions and disposed between the first process chamber and the region;

a second isolation valve having open and sealed positions and disposed between the second process chamber and the region;

a gas supply;

a gas flow path connecting the gas supply to the region between the process chambers, wherein the gas flow path includes a gas flow valve having open and closed positions;

vacuum lines connected to each of the process chambers and the region between the process chambers, wherein each vacuum line includes a vacuum valve having open and closed positions;

a controller for controlling the respective positions of the gas flow valve and the vacuum valves, wherein when the first and second valves are in their respective open positions, the controller controls the gas flow valve and the vacuum valves to cause gas to flow from the gas supply into the region between the process chambers, and from the region between the process chambers into the respective process chambers and out of the process chambers via the respective vacuum lines connected to the process chambers.

7. The system of claim 6 wherein when the first and second isolation valves are in their respective sealed positions, the controller controls the gas flow valve and the vacuum valves to cause gas to flow from the gas supply into the region between the process chambers and out of the region via the vacuum line connected to the region between the process chambers.

8. The system of claim 7 further including components of a substrate transfer mechanism in the region between the process chambers, wherein the gas flow in the region between the process chambers sweeps particulate contamination on components of the substrate transfer mechanism out of the region between the process chambers.

9. A substrate processing system comprising:

first and second process chambers;

a region between the first and second process chambers;

a first isolation valve having open and sealed positions and disposed between the first process chamber and the region;

a second isolation valve having open and sealed positions and disposed between the second process chamber and the region;

first and second gas supplies;

a gas flow path connecting the first gas supply to the first process chamber, and a second flow path connecting the second gas supply to the second process chamber, wherein each gas flow path includes a gas flow valve having open and closed positions;

vacuum lines connected to the region between the process chambers, wherein the vacuum line includes a vacuum valve having open and closed positions;

a controller for controlling the respective positions of the gas flow valves and the vacuum valve, wherein when the first and second isolation valves are in their respective open positions, the controller controls the gas flow valves and the vacuum valve to cause gas to flow from the first gas supply into first process chamber, and from the first process chamber into the region between the process chambers; and from the second gas supply into the second process chamber, and from the second process chamber into the region between the process chambers, wherein the gas flowing from the process chambers into the region between the process chambers flows out of the region between the process chambers via the vacuum line connected to the region between the process chambers.

10. The system of claim 9 further including:

a third gas supply; and a flow path connecting the third gas supply to the region between the process chambers and including a gas flow valve having open and closed positions;

wherein when the first and second isolation valves are in their respective sealed positions, the controller controls the gas flow valves and the vacuum valve to cause gas to flow from the third gas supply into the region between the process chambers, and out of the region between the process chambers via the vacuum line connected to the region.

11. The system of claim 10 further including components of a substrate transfer mechanism in the region between the process chambers, wherein the gas flow in the region between the process chambers sweeps particulate contamination on components of the substrate transfer mechanism out of the region between the process chambers.

* * * * *